United States Patent [19]

Davis et al.

[11] 4,181,889

[45] Jan. 1, 1980

[54] CITIZENS BAND TRANSMITTER WITH OVERALL ENVELOPE FEEDBACK FROM ANTENNA COUPLING FILTER

[75] Inventors: James L. Davis, Kokomo; Michael J. Easterwood, Russiaville, both of Ind.

[73] Assignee: General Motors Corporation, Detroit, Mich.

[21] Appl. No.: 939,466

[22] Filed: Sep. 5, 1978

[51] Int. Cl.² .............................................. H04B 1/04
[52] U.S. Cl. .................................. 325/124; 325/150; 325/187; 325/159; 325/144
[58] Field of Search ............... 325/123, 124, 128, 150, 325/159, 178, 184, 187, 179, 144, 151, 186

[56] References Cited

U.S. PATENT DOCUMENTS

| | | | |
|---|---|---|---|
| 2,297,931 | 10/1942 | White | 325/159 |
| 2,426,579 | 8/1947 | Peckham | 325/151 |
| 3,486,128 | 12/1969 | Lohrmann | 325/159 |
| 4,044,308 | 8/1977 | Stites et al. | 325/144 |

Primary Examiner—Robert L. Griffin
Assistant Examiner—Alexander Gerasimow
Attorney, Agent, or Firm—Robert M. Sigler

[57] ABSTRACT

A citizens band transmitter employing negative overall envelope feedback in the final RF stage obtains the feedback signal from a filter in the antenna coupling network which has a phase shift of 90 degrees or an odd multiple thereof at the radio frequency. A pair of detector diodes have their cathodes connected to opposite ends of filter and their anodes connected to a low pass filter to provide an envelope of the higher of the two voltages at either end of the filter in the coupling circuit in negative feedback to the modulating signal.

1 Claim, 1 Drawing Figure

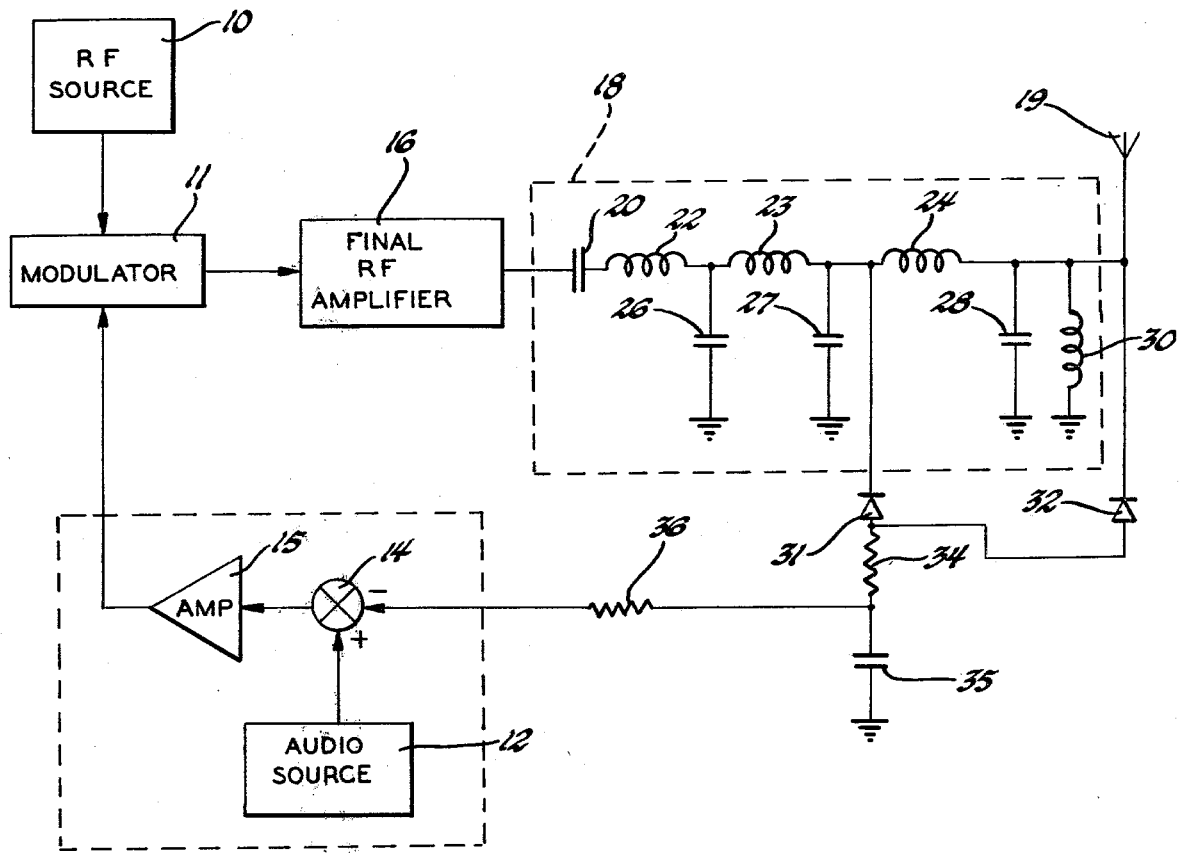

CITIZENS BAND TRANSMITTER WITH OVERALL ENVELOPE FEEDBACK FROM ANTENNA COUPLING FILTER

BACKGROUND OF THE INVENTION

This invention relates to citizens band radio transmitters and particularly to those employing negative overall envelope feedback in the final RF stage. Such feedback performs the dual function of reducing distortion in the final RF amplifier and further protecting the final RF amplifier from unexpectedly large loads such as a deterioated antenna or an accidental short of the antenna output terminals.

In this technique a detector provides the envelope of the transmitter output signal in negative feedback to a summing junction where it is combined with the modulating signal before the modulator and final RF amplifier to maintain output power substantially constant or at least lower than a predetermined maximum. However, if only the output voltage of the transmitter is detected but the antenna impedance is significantly less than that for which the transmitter is designed, the output current may be large enough to boost the output power much greater than anticipated in spite of the voltage envelope feedback. Therefore, it is desired to provide the higher of two voltages near the output of the transmitter which are separated, at the radio frequency, by substantially a 90 degree phase shift or an odd multiple thereof.

In prior art, U.S. Pat. No. 2,297,931 to E.L.C. White shows an overall envelope feedback configuration which employs a coaxial cable between the final RF amplifier and the antenna, the coaxial cable being tapped for the feedback detector in two places separated by one quarter wavelength of the radio frequency. At the frequency of citizens band transmissions, however, such a coaxial cable would have to be probably close to one meter long in order to accommodate even one quarter wavelength. The White disclosure further specifies that the taps be as close as possible to the transmitter end of the cable to minimize reflections from the antenna end; and this implies an even longer cable. Thus, the approach of White would involve a long coaxial cable with connections outside the set to taps on said cable, which is not an ideal arrangement for a portable or vehicle mounted citizens band transceiver. It would be preferable if a source for the negative overall envelope feedback signal could be found within the transmitter case and preferably in already existing circuitry.

SUMMARY OF THE INVENTION

It is, therefore, an object of this invention to provide an improved citizens band transmitter having negative overall envelope feedback to protect the final RF amplifier but obtaining said feedback without additional connections or taps external to the main body of the transmitter.

It is a further object of this invention to provide an improved citizens band transmitter which obtains an overall envelope feedback signal from circuitry already present in the transmitter output for minimum additional cost.

These objects and others are obtained from a detector tap at each end of a portion of the final harmonic filter in the antenna coupling network at the transmitter output. Since signals undergo a 90 degree phase shift within this portion of the filter at the radio frequency of the transmitter, the desired voltage relationship of one quarter wavelength phase difference is present at the opposite ends of this portion of the filter. Since the filter is already present in the radio circuitry, no additional external connections are required to any coaxial cable and the additional expense of the overall envelope feedback is minimized.

Further details and advantages of this invention will be apparent from the drawing and following description of the preferred embodiment.

DESCRIPTION OF THE PREFERRED EMBODIMENT

An RF source 10 comprises an oscillator which generates a carrier signal at a predetermined radio frequency and supplies it to a modulator 11. An audio source 12 provides a signal in the audio frequency range to a summing junction 14 where it is summed with the overall envelope feedback signal, the difference being amplified by amplifier 15 and supplied to modulator 11 to modulate the signal from RF source 10. The modulated RF signal from modulator 11 is supplied to a final RF amplifier 16 which may, in some configurations, be somewhat nonlinear.

In order to reduce any second or higher order harmonics generated in final RF amplifier 16, a coupling network 18 is connected between the final RF amplifier 16 and an antenna 19. Coupling network 18 comprises, in this embodiment, a capacitor 20 connected in series with three inductors 22, 23 and 24. Coupling network 18 further comprises capacitors 26, 27 and 28 connected to ground from, respectively, the junction of inductors 22 and 23, the junction of inductors 23 and 24 and the junction of inductor 24 and antenna 19. Coupling network 18 finally comprises an inductor 30 connected in parallel with capacitor 28 to ground. The combinations of inductor 22 with capacitor 26 and inductor 23 with capacitor 27 comprise cascaded low pass filters with break points below the second harmonic of the radio frequency of RF source 10. The combination of inductor 24 with capacitor 28 and inductor 30 comprises a bandpass filter which further reduces the second and higher order harmonics of the radio frequency of RF source 10.

A pair of diodes 31 and 32 have cathodes connected to opposite ends of inductor 24 and anodes connected together through a resistor 34 and a capacitor 35 to ground. The junction of resistor 34 and capacitor 35 is connected by a resistor 36 to a negative input of summing junction 14.

Due to the characteristics of the coupling network 18, a 90 degree phase shift exists at the radio frequency of RF source 10 across inductor 24. Thus, if the voltage seen by the cathode of diode 32 is the output voltage of the transmitter, the voltage seen by the cathode of diode 31 on the other side of inductor 24 is 90 degrees out of phase with the output voltage of the transmitter and thus varies with the output current of the transmitter. The connection of the anodes of diodes 31 and 32 together creates a "highest wins" configuration so that the higher of the two voltages detected by diodes 31 and 32 is impressed on a low pass filter comprising capacitor 35 and resistor 36. The envelope of the higher voltage detected by diodes 31 and 32, which is therefore the envelope of the higher of the voltage or current output of the transmitter, is thus fed back to summing junction 14 and there combined negatively with the audio signal to help reduce distortion and otherwise protect final RF amplifier 16. Resistor 34 is inserted in series with diodes 31 and 32 to limit current through those diodes and thus help further reduce second order and higher harmonics in the transmitter output signal. It may be noted in passing that the cathode of diode 31 could also have been connected to the junction of inductor 22 and capacitor 20, since that junction is 270 degrees out of phase with the junction of inductor 24 and antenna 19. Since a 270 degree phase shift is an odd multiple of a 90 degree phase shift, the working criterion would be met by such an arrangement.

In addition to the embodiment shown, other equivalent embodiments exist that would occur to one skilled in the art after reading this disclosure. Therefore, this invention should be limited only by the claim which follows.

The embodiments of the invention in which an exclusive property or privilege is claimed are defined as follows:

1. In an AM citizens band transmitter including means effective to generate a carrier signal at a radio frequency, means effective to modulate the radio frequency carrier signal with an audio frequency signal, means effective to amplify the modulated radio frequency carrier signal and an antenna, all said means except the antenna adapted to be contained within a case, a coupling and protective circuit adapted for containment within the case and comprising, in combination:

a coupling circuit effective to couple the modulated RF signal amplifying means to the antenna, said circuit including at least one LC-type harmonic suppressing filter having a phase shift of substantially 90 degrees or an odd multiple thereof at the radio frequency, whereby the AC voltage at one end of the filter thus varies proportionally with the AC current at the other end of the inductor;

a first diode having a cathode connected to the one end of the filter;

a second diode having a cathode connected to the other end of the filter, the anodes of the first and second diodes being connected together, whereby the voltage at the connected anodes varies as the greater of the voltage and current at the other end of the inductor;

a low pass filter connecting the anodes of the diodes to the RF carrier signal modulating means so as to provide thereto in negative feedback a signal varying with the envelope of the greater of the voltage and current supplied to the antenna to reduce distortion in the modulated RF signal amplifier and protect it from low antenna impedance, said feedback being accomplished totally with circuitry adapted for containment within the case.

* * * * *